United States Patent [19]

Van Kessel et al.

[11] 3,921,091

[45] Nov. 18, 1975

[54] AMPLIFIER CIRCUIT

[75] Inventors: Theodorus Jozef Van Kessel; Gerrit Jan Scholl, both of Eindhoven, Netherlands

[73] Assignee: U.S. Philips Corporation, New York, N.Y.

[22] Filed: Jan. 16, 1975

[21] Appl. No.: 541,445

Related U.S. Application Data

[63] Continuation of Ser. No. 392,793, Aug. 29, 1973, abandoned, which is a continuation of Ser. No. 251,008, May 8, 1972, abandoned.

[30] Foreign Application Priority Data

May 14, 1971 Netherlands ....................... 7106620

[52] U.S. Cl. .................... 330/30 D; 330/28; 330/29; 330/69

[51] Int. Cl.[2] ............................................ H03F 3/68

[58] Field of Search ........... 330/9, 25, 28, 29, 30 D, 330/69

[56] References Cited

UNITED STATES PATENTS

| | | | |
|---|---|---|---|
| 3,323,078 | 5/1967 | Falk | 330/29 X |
| 3,502,997 | 3/1970 | Narud et al. | 330/29 |
| 3,512,096 | 5/1970 | Nagata et al. | 330/29 |

*Primary Examiner*—R. V. Rolinec
*Assistant Examiner*—Lawrence J. Dahl
*Attorney, Agent, or Firm*—Frank R. Trifari; Henry I. Steckler

[57] ABSTRACT

Amplifier circuit having a gain which is adjustable by means of a control quantity. The circuit comprises a differential transistor pair the tail current of which is supplied by an input amplifier. The collector of one of the transistors of the differential part is connected in a negative-feedback sense to an input of the input amplifier, and the control quantity is applied as a differential voltage to the bases of the transistors of the differential pair.

11 Claims, 9 Drawing Figures

AMPLIFIER CIRCUIT

This is a continuation of application Ser. No. 392,793, filed Aug. 29, 1973, now abandoned, which in turn is a continuation of application Ser. No. 251,008, filed May 8, 1972, now abandoned.

The invention relates to an amplifier circuit having a gain which is adjustable by means of a control signal and comprising an input amplifier to an input of which an input signal may be applied and the output of which is connected to the emitters of a first and a second transistor to the bases of which the control signal may be applied as a differential voltage, providing a division of the output current of the input amplifier between the two transistors which is determined by the said control signal, whilst an output signal may be derived from the current through the second transistor.

Such an amplifier circuit is described, for example, in "Electronics," Aug. 9, 1965, page 78. Such an amplifier cricuit is required to provide amplification of a signal, the degree of amplification being adjustable over a certain range by means of a control signal. In the amplifier circuit shown in the said paper this is achieved in that the tail current, i.e., the sum of the emitter currents, of the two transistors connected as a differential pair, which current is determined by the input voltage, is divided between these transistors in accordance with the control signal which is applied as a differential voltage to the bases of these transistors, for the ratio between the collector currents of two transistors connected as a differential pair is completely determined by the differential voltage at their bases, irrespective of the value of the tail current. Consequently, the ratio between one of the collector currents and the tail current also is completely determined by the value of the differential voltage applied to the bases of the transistors. Hence, deriving the output current from an impedance to which the collector current of one of the transistors is supplied provides an amplifier circuit the gain factor of which is adjustable by means of the differential voltage applied to the bases of the transistors. Obviously, the control signal which results in this differential voltage may be adjusted either by hand or automatically, for example to obtain automatic gain control.

The amplifier circuit described in the said paper suffers from several limitations. For example, the range in which the gain factor is adjustable is limited, for the control current of one of the transistors can never be greater than the tail current, so that the ratio between these currents always is less than unity. The collector current of the other transistor is not utilized at all, so that no optimum use of the amplifier circuit is achieved. Finally, in certain uses it is desirable for the relationship between the gain factor and the control signal to be logarithmic, and this requirement is not fully satisfied by the amplifier circuit described.

It is an object of the invention to provide an amplifier circuit which does not suffer from the said limitations.

For this purpose an amplifier circuit according to the invention is characterized in that the output of the input amplifier has the nature of a voltage source and the collector of the first transistor is connected in a negative feedback sense to an input of the input amplifier, with the result that the output current of this input amplifier is controlled to a value such that the collector current of the first transistor which flows via the negative feedback loop is determined by the input signal and is independent of the control quantity.

In contrast with the known circuit, in the circuit according to the invention the input signal does not directly, i.e., without the influence of the control signal, determine the tail current but the collector current of the first transistor. By connecting the output impedance in the collector circuit of the second transistor this ensures that there is no longer any limitation of the adjusting range, because the ratio between the collector currents of the two transistors may be greater or smaller than unity.

Furthermore there is the advantage that even if the gain factor is adjustable in a wide range the risk of a transistor of the differential pair being cut off is nil, because the D.C. current is automatically matched to the D.C. component of the input signal.

Finally for certain uses the advantage is provided that the relationship between the control signal and the gain factor is completely logarithmic.

If a limitation of the adjusting range is not objectionable, the circuit according to the invention may be used with optimum efficiency by including the output impedance in the tail of the differential pair, which is made possible because in the circuit according to the invention the value of the tail current, just like that of the collector current of the second transistor, depends upon the value of the control signal. This connection of the output impedance ensures that the current through both transistors can be utilized, in contrast with the known circuit in which only one of these currents is utilized. A disadvantage of this configuration when compared with the aforementioned configuration is that now there is a limitation of the adjusting range and that the relationship between the gain factor and the control signal is no longer entirely logarithmic. In what degree this actually is objectionable will obviously depend entirely upon the intended use.

The amplifier circuit according to the invention has the further advantage that a highly linear gain is obtainable. A final advantage of the circuit is that it may be expanded and/or modified in a simple manner to enable it to comply with a given specific purpose, as will be set out more fully with reference of the embodiments shown in the Figures.

Figure 1:
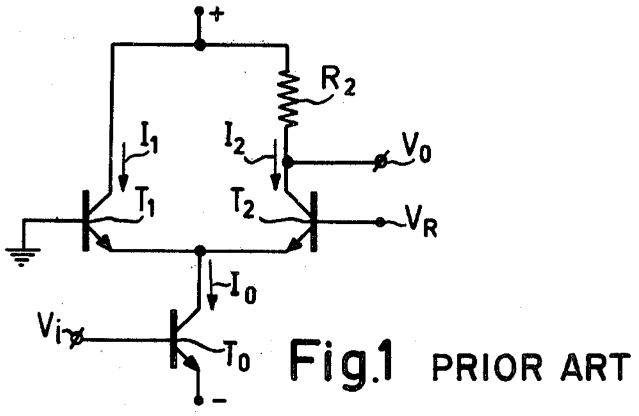
Fig.1 PRIOR ART
FIG. 1 shows the known circuit.

The known amplifier circuit described in the aforementioned paper and shown in FIG. 1 comprises two transistors $T_1$ and $T_2$ connected as a differential pair. An input transistor $T_o$ to the base of which the input voltage $V_i$ is applied as connected as an amplifier in the common emitter circuit of the said transistors. The gain control signal is applied as a differential voltage to the bases of the transistors $T_1$ and $T_2$. In the embodiment shown the base of the transistor $T_1$ is connected to earth, the control voltage $V_R$ being applied to the base of the transistor $T_2$. The output voltage $V_o$ is derived from a resistor $R_2$ included in the collector circuit of the transistor $T_2$.

The operation of the circuit is based on the recognition that the ratio between the collector currents $I_1$ and $I_2$ of the transistors $T_1$ and $T_2$ respectively is completely determined by the control voltage $V_R$, for from the Figure it will be seen that this control voltage $V_R$ is equal to the difference between the base emitter voltages of the transistors $T_2$ and $T_1$. The base emitter voltage of a transistor may be written $$V_{be} = \frac{kT}{q} \ln \frac{I}{I_s},$$

where $k$ is Boltzmann's constant, q is the elementary charge, T is absolute temperature and $I_s$ is the saturation current of the transistor. Assuming the saturation currents of the transistors $T_1$ and $T_2$ to be equal, the control voltage $V_R$ is $$V_R = \frac{kT}{q} \ln \frac{I_2}{I_1} \qquad (1)$$

Owing to this logarithmic relationship between the current ratio $$\frac{I_2}{I_2}$$

and the control voltage $V_R$ a comparatively small variation of the control voltage $V_R$ will cause a large variation in this current ratio.

To calculate the gain of the circuit is assumed that $I_o = S\ V_i$, where $I_o$ is the collector current and S is the transconductance of the transistor $T_o$. Neglecting the base currents of the transistors $T_1$ and $T_2$ this collector current $I_o$ will be divided between the transistors $T_1$ and $T_2$ in a ratio $$\frac{I_2}{I_1} = f$$

which satisfies equation (1). The output voltage $V_o$ then will be:

$$V_o = -\frac{f}{f+1} S\ R_2 V_i \qquad (2)$$

From this it will be obvious that the gain factor $$\frac{V_o}{V_i}$$

has a maximum, $-SR_2$, which is reached when $f$ is infinite. It will further be obvious that a given change of the current ratio $f$ causes only a considerably smaller change in the total gain factor $\beta$. Assuming, for example, that the control voltage $V_R$ can vary between the limits + 120 mV and −120 mV, then according to equation (1) there is associated with this range of variation of the control voltage $V_R$ a range of variation of the current ratio $$\frac{I_2}{I_1}$$

of $$\frac{1}{100} \leqslant f \leqslant 100.$$

Substitution of this limiting value of the current ratio $f$ provides the limiting values $$\frac{1}{101} SR_2 \leqslant \left| \beta \right| \leqslant \frac{100}{101} SR_2$$

for the gain factor $\beta$. Thus, whilst the current ratio varies by a factor $10^4$, the gain factor $\beta$ varies only by a factor $10^2$. The equation (2) further shows that owing to the term $$\frac{f}{f+1}$$

there is no truly logarithmic relationship between the gain factor and the bias voltage $V_R$.

Figure 2:
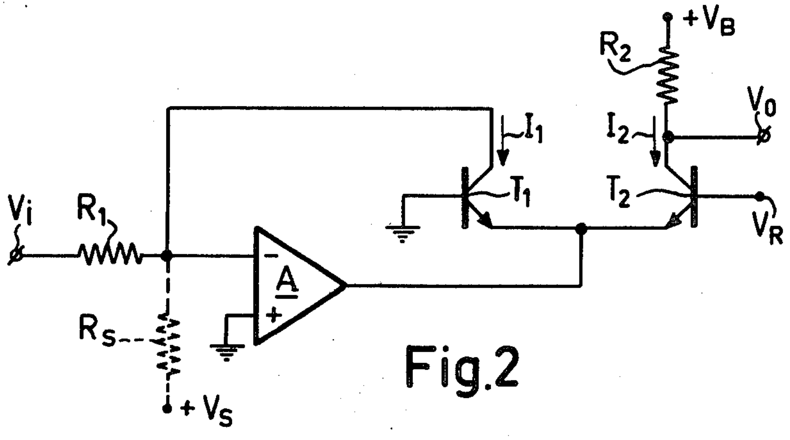
FIGS. 2 to 9 show embodiments of the amplifier circuit according to the invention.

FIG. 2 shows a first embodiment of an amplifier circuit according to the invention. Similarly to the known circuit the circuit uses two transistors $T_1$ and $T_2$ which are connected as a differential pair and to the bases of which the control signal is applied as a differential voltage. The collector circuit of the transistor $T_2$ again includes a resistor $R_2$ from which the output voltage $V_o$ can be derived.

The emitters of the transistors $T_1$ and $T_2$ are connected to the output of an amplifier A, which has an inverting input (−) and a non-inverting input(+). The non-inverting input is connected to a point of constant potential, in the embodiment shown to earth. The inverting input of the amplifier A is connected to the collector of the transistor $T_1$ and also, via a resistor $R_1$, to the input terminal of the amplifier circuit to which the input voltage $V_i$ is applied.

The amplifier A may advantageously be an operational amplifier having a large gain factor and a low input current, as will be apparent from what follows. If the requirements to be satisfied are not too stringent, however, a simpler amplifier, for example a single transistor, may be used. In the latter case the amplifier has only one input. However, the provision of two inputs is not essential at all. An essential feature is only that the amplifier has an inverting input, so that by connecting this input to the collector of the transistor $T_1$ there is produced via this transistor a negative feedback loop for the amplifier A. Necessarily this amplifier should have an output with the nature of a voltage source.

The amplifier constructed in this manner is suitable for positive input signals only. Assuming the input voltage $V_i$ to be positive, the operation of the amplifier circuit is as follows. The output voltage of the amplifier A will impose a tail current on the transistor pair $T_1$ and $T_2$ such that the voltage at its inverting input is equal to the potential at its non-inverting input, i.e., equal to earth potential. As a result, a current equal to $$\frac{V_i}{R_1}$$

will flow through the resistor $R_1$ and will be entirely passed by the transistor $T_1$, because it has been assumed that the amplifier A has a very small input current. Hence the collector current $I_1$ of the transistor $T_1$ may be written $$I_1 = \frac{V_i}{R_1}.$$

Just as in the circuit shown in FIG. 1, the collector currents $I_1$ and $I_2$ of the transistor $T_1$ and $T_2$ are in a ratio $$f = \frac{I_2}{I_1},$$

with $$V_R = \frac{kT}{q}$$

ln $f$. The output voltage $V_o$ across the resistor $R_2$ can be written $$V_o = -f \cdot \frac{R_2}{R_1} \cdot V_i \qquad (3)$$

By means of this expression it may simply be shown that the variation in the gain factor associated with a given adjustment range is considerably greater than in the circuit shown in FIG. 1. Again assuming the control voltage $V_R$ to have the limits + 120 mV and − 120 mV and hence an adjustment range for the current ratio $$\frac{I_2}{I_1} = f$$

for which $$\frac{1}{100} \leq f \leq 100,$$

then equation (3) gives the following limiting values of the gain factor $\beta$:

$$\frac{1}{100} \frac{R_2}{R_1} \leq |\beta| \leq 100 \frac{R_2}{R_1}$$

Consequently, in the circuit according to the invention, with the assumed range of variation of the control voltage $V_R$, the gain factor varies by a factor of $10^4$, whilst in the known circuit shown in FIG. 1 it varied by a factor of $10^2$ only. Thus the range in which the gain factor $\beta$ can be varied has considerably increased. Furthermore, combination of the equation (3) and the expression for the current ratio $f$ shows that there is a purely logarithmic relationship between the gain factor $\beta$ and the bias voltage $V_R$. In addition, when a good operational amplifier A is used a highly linear amplification will be obtained.

The circuit shown in FIG. 2 may be modified in several respects, however, these modifications do not involve essential differences of operation. It will be clear that the input voltage $V_i$ may alternatively be applied to the non-inverting input of the amplifier A, in which case the resistor $R_1$ is connected to a point of constant potential, for example to earth. The voltage of the inverting input of the amplifier A will again follow the voltage at the non-inverting input, that is the input voltage. However, in contradistinction to the circuit of FIG. 2 the modified circuit will amplify negative input voltages only.

To enable both positive and negative input voltages to be amplified by means of the circuit shown in FIG. 2, the non-inverting input of the amplifier A may obviously be connected to a point of negative potential. Then an input direct current will always flow through the resistor $R_1$. A more elegant solution is shown in broken lines in FIG. 2, the inverting input terminal being connected through a resistor $R_S$ to a point of positive constant potential $+V_S$. In this configuration the transistor $T_1$ will always pass aa bias direct current $$I_1 = \frac{V_s}{R_s}$$

whilst no direct current flows through the input resistor.

Figure 3:
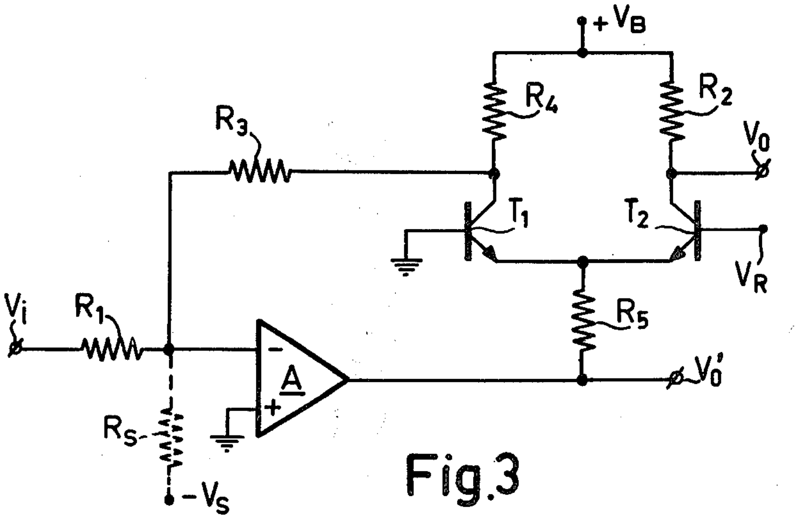

FIG. 3 shows a second embodiment of the circuit according to the invention, in which elements corresponding to those of FIG. 2 are designated by the same reference numerals. This amplifier circuit is primarily distinguished from that shown in FIG. 2 in that a resistor $R_3$ is connected between the inverting input of the amplifier A and the collector of the transistor $T_1$, whilst this collector is also connected, via a resistor $R_4$, to a point of constant potential $+V_B$. As a result the voltage across the resistor $R_4$ will vary as a function of the signal current flowing through the resistor $R_3$ and hence of the input voltage $V_i$, so that this resistor will carry a signal current which is added to the signal current carried by the resistor $R_3$. In a manner similar to that described with reference to FIG. 2 this gives for the signal current $V_o$ across the resistor $R_2$ $$V_o = -\frac{(R_3 + R_4)R_2}{R_1 R_4} f V_i \qquad (4)$$

Consequently a choice of the various resistors provides a great freedom in the choice of the gain factor.

The gain factor may be additionally increased by connecting a resistor $R_5$ in the common emitter lead of the transistors $T_1$ and $T_2$ and by deriving the output voltage $V_o'$ from this resistor $R_5$, for this resistor $R_5$ carries the sum of the currents of the transistors $T_1$ and $T_2$, so that both transistor currents are utilized. This is expressed in the output voltage $V_o'$ by a factor $(1 + f)$ instead of the factor $f$ in the expressions for the output current $V_o$ derived from the resistor $R_2$ (see equations (3) and (4)). It will be clear that in the circuit shown in FIG. 2 a similar arrangement may be used to achieve additional gain. A disadvantage which is significant in some uses consists in that owing to the term $(1 + f)$ the relationship between the gain factor and the bias voltage $V_r$ is no longer truly logarithmic.

Quiescent currents are supplied to the transistors $T_1$ and $T_2$ in any case. Since these quiescent currents may be too large, the inverting input of the amplifier A may be connected through a resistor $R_S$ to a point of constant negative potential $-V_S$ to obtain suitable adjustment. A further adjustment dependent on the control signal is superfluous, because the quiescent currents of transistors $T_1$ and $T_2$ are automatically adjusted, because the total current through $T_1$ is dependent of the input signal.

Figure 4:
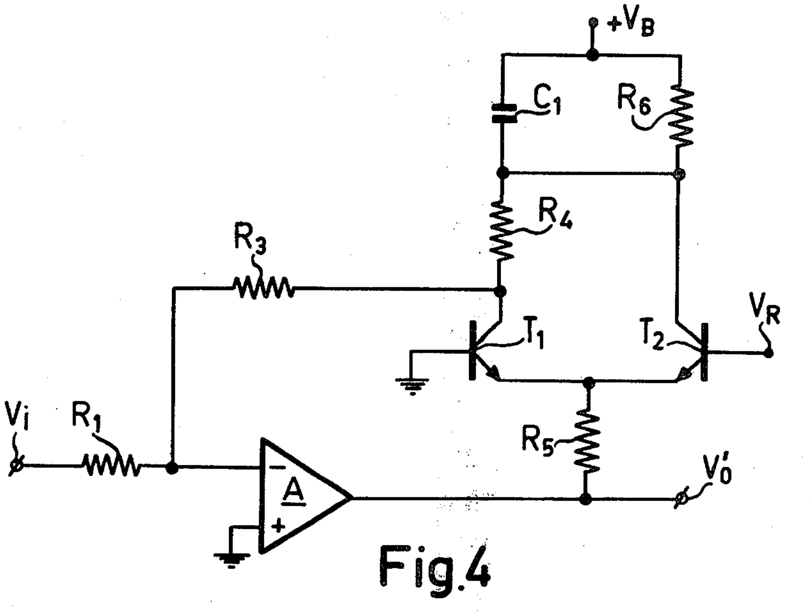

FIG. 4 shows an embodiment of the amplifier circuit which enables a desired frequency characteristic of the gain to be realized. The circuit largely corresponds to that shown in FIG. 3. However, the resistor $R_4$ included in the collector circuit of the transistor $T_1$ now is connected via the parallel combination of a capacitor $C_1$ and a resistor $R_6$ to a point of constant potential $+V_B$, as is the collector of the transistor $T_2$. For high frequencies the behaviour of the circuit will be equal to that of the circuit of the FIG. 3, because at these frequencies the resistor $R_4$ is connected to a point of constant potential via the capacitor $C_1$ which will act as a short circuit. At low frequencies, however, the capacitor $C_1$ presents a high impedance, so that the voltage of the junction point of the capacitor $C_1$ and the resistor $R_4$ largely follows the variations of the signal voltage, so that the gain is smaller than in the first-mentioned case. Altogether a frequency characteristic of the gain is obtained which is level at low frequencies, ascends at a given frequency and above another given frequency levels out again. The knees are determined by the values of the resistors $R_3$, $R_4$ and $R_6$ and of the capacitor $C_1$.

In this embodiment also a desired direct current bias is obtainable in the manner described with reference to FIG. 3.

Figure 5:
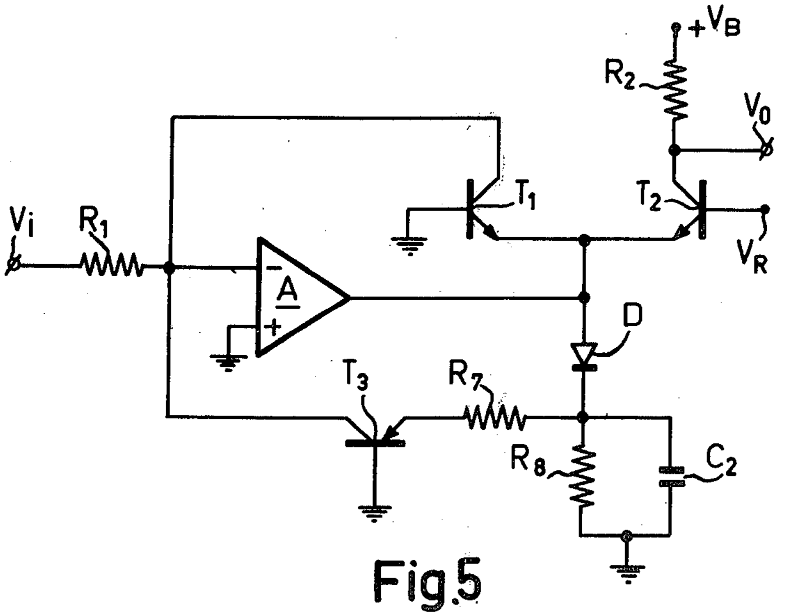

FIG. 5 shows an embodiment which largely corresponds to the circuit shown in FIG. 2, however, this embodiment includes means to provide automatic direct-current biasing. For this purpose the output of the amplifier A is connected, via a diode connected in the forward direction and the parallel combination of a resistor $R_8$ and a capacitor $C_2$, to a point of constant potential, for example earth. The voltage across $R_8$ and $C_2$ is applied via a resistor $R_7$ to the emitter of a pnp transistor $T_3$ the collector of which is connected to the inverting input of the amplifier A and the base of which is connected to a point of constant potential. As a result, a direct current is supplied to the inverting input of the amplifier A in a manner similar to that used in the circuit of FIG. 2 and this direct current is automatically matched to the amplitude of the input signal and always has a value such that the transistor $T_1$ is always conducting.

The use of a transistor $T_3$ has the advantage that owing to the high collector impedance the direct current at the input of the amplifier A is obtained from a high-quality current source. If no exacting requirements are to be satisfied, a simpler circuit may be used, in which, for example, the transistor $T_3$ and the resistor $R_8$ may be dispensed with.

Figure 6:
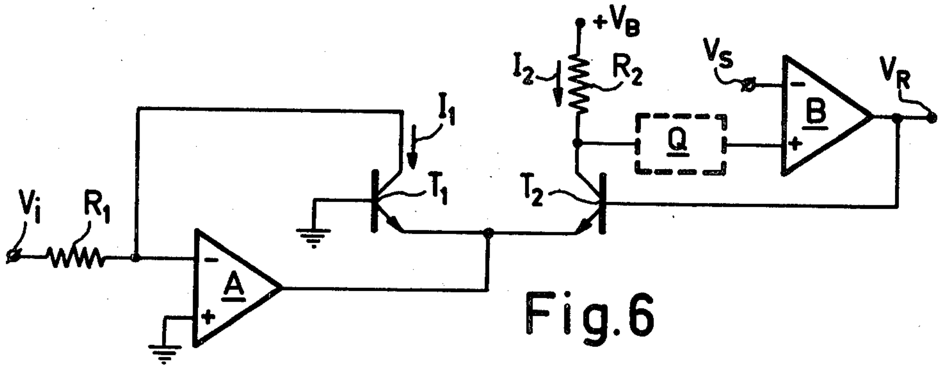

FIG. 6 shows an embodiment of the amplifier circuit according to the invention which has been expanded to form a logarithmic amplifier. The control voltage $V_R$ is applied to the base of the transistor $T_2$ by an additional amplifier B to one of the inputs of which is applied the voltage produced across the resistor $R_2$ included in the collector circuit of the transistor $T_2$. A reference voltage $V_s$ is applied to the second input of this amplifier B. Thus the amplifier B operates as a comparison circuit and will always apply to the base of the transistor $T_2$ a bias voltage $V_R$ such that the voltages at its two inputs are equal, that is $V_B - I_2R_2 = V_S$. Because furthermore:

$$V_R = \frac{kT}{q} \ln \frac{I_2}{I_1}$$

and $$I_1 = \frac{V_i}{R_1},$$

it follows that $$V_R = -\frac{kT}{q} \ln \frac{R_2}{R_1} \frac{1}{V_B - V_S} V_i$$

Consequently the use of the control voltage $V_R$ as the output voltage provides a logarithmic amplifier. This circuit has the additional advantage that a detection circuit Q may be connected between the resistor $R_2$ and one input of the amplifier B. This results in a logarithmic amplifier which determines the logarithm of the input voltage $V_i$ according to a criterion determined by the detection circuit Q. For example, in the case of a modulated signal the detection circuit Q may be designed so that only the envelope is transmitted to the amplifier B. Thus the output voltage $V_R$ is the logarithm of this envelope, whilst the carrier wave of constant amplitude is set up across the resistor $R_2$. Furthermore the detection circuit used may be a synchronous leak detector or a R. M. S. detector.

Figure 7:
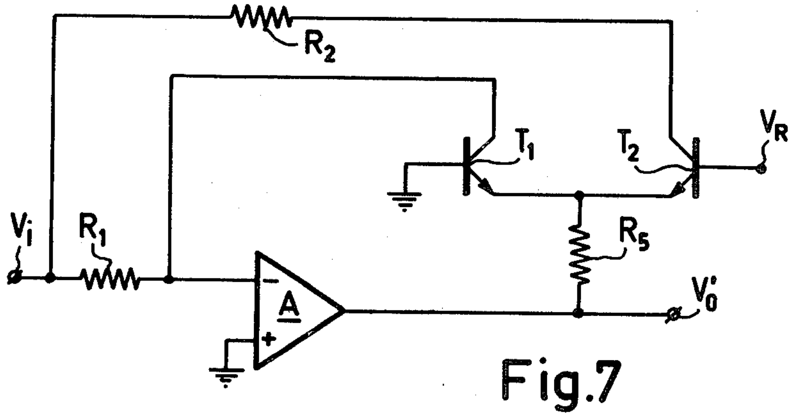

FIG. 7 shows an embodiment of the circuit according to the invention which enables an adjustable input impedance to be realized. The resistor $R_2$ here is not connected to a point of constant potential, but directly to the input terminal of the circuit. Consequently the input current of the circuit is equal to the sum of the currents through the transistors $T_1$ and $T_2$. Because the value of the current through the transistor $T_2$ depends upon the control voltage $V_R$, the input current and hence the input impedance also depend upon this control voltage $V_R$. An output voltage $V_o'$ may be derived from a resistor $R_5$ connected in the common emitter lead of the transistors $T_1$ and $T_2$, the gain being again dependent upon the control voltage $V_R$.

Figure 8:
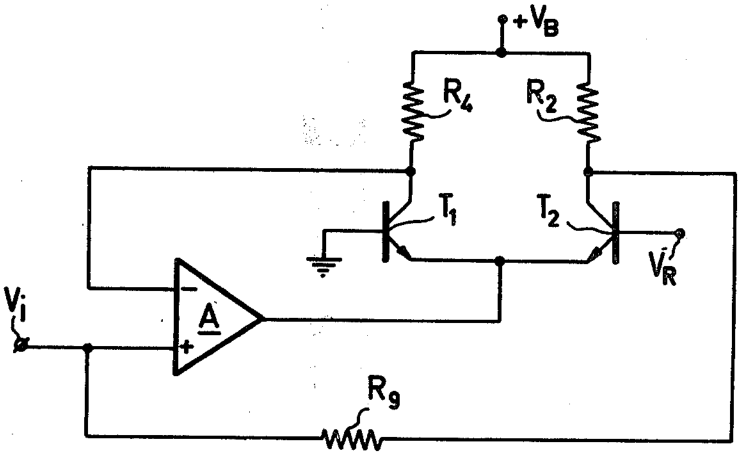

FIG. 8 shows an embodiment which also enables an adjustable input impedance to be obtained. The input signal $V_i$ is applied to the non-inverting input of the amplifier A, which via a resistor $R_9$ is connected to the collector of the transistor $T_2$. The collectors of the transistors $T_1$ and $T_2$ are also connected via resistors $R_4$ and $R_2$ respectively to a point of constant potential $+V_B$.

The voltage at the inverting input of the amplifier A will follow the input voltage $V_i$, so that the transistor $T_1$ passes a current which is determined by the input voltage $V_i$ and the resistor $R_4$. The current passed by the transistor $T_2$ will be greater by a factor $f$, which is again determined by the control voltage $V_R$. This current through the resistor $T_2$ is partially supplied via the resistor $R_2$ and partially via the resistor $R_9$, which latter current is the input current. The input resistance is:

$$R_i = \frac{R_o + R_2}{1 - f\frac{R_2}{R_4}}$$

This expression shows that the input resistance $R_i$ as a function of the current ratio $f$ varies asymptotically, the asymptote being $$f = \frac{R_4}{R_2}.$$

Figure 9:
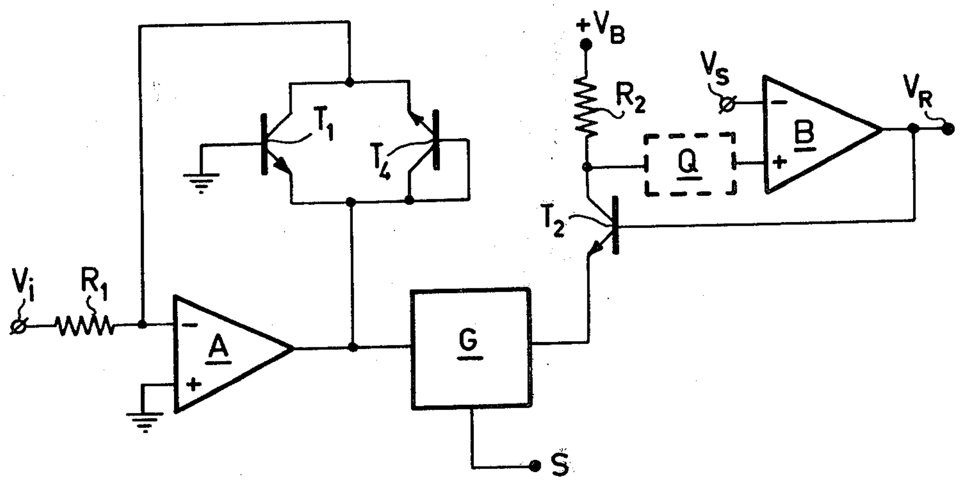

FIG. 9 shows an embodiment of the amplifier circuit according to the invention which largely corresponds to the embodiment shown in FIG. 6, but unlike the latter is suitable for both positive and negative input signals. For this purpose the collector emitter path of the transistor $T_1$ is shunted by an npn transistor $T_4$ which is connected as a diode. Furthermore there is connected between the emitters of the transistors $T_1$ and $T_2$ a full-wave rectifier G which rectifies the output voltage of the amplifier A. The rectifier may have an additional output S at which a signal may be obtained which indicates the polarity of the input signal.

The embodiment shown has the advantage that it enables three transistors $T_1$, $T_2$ and $T_4$ of the same conductivity to be used which is the case of integration on the same semiconductor surface may have highly identical properties.

From the above it will be appreciated that many embodiments of the circuit according to the invention are possible. For example, two amplifier circuits may be combined to permit two input signals to be multiplied or divided by one another. Furthermore the quiescent current setting of the transistors may be realized in a variety of manners, and various input amplifiers may be used.

What is claimed is:

1. A circuit comprising an amplifier having an at least a first input means for receiving an input signal to be amplified, and a voltage source output means having a low output impedance; first and second transistors each having emitter electrodes coupled to said output means, base electrodes adapted to receive a differential control signal, whereby a division of the output current from said amplifier is effective between said transistors in accordance with said control signal, and collector electrodes; means coupled to said second transistor for providing an output signal in accordance with the current therethrough; and alternating and direct current negative feedback means coupled between one amplifier input means and said first transistor collector.

2. A circuit as claimed in claim 1 wherein said providing means comprises an impedance element coupled between said amplifier output means and both of said emitters.

3. A circuit as claimed in claim 1 wherein said feedback means comprises a first impedance element, and further comprising a second impedance element having a first end coupled to said first transistor collector and a second end adapted to receive a constant potential.

4. A circuit as claimed in claim 3 wherein said second impedance element comprises a first resistor, a capacitor series coupled to said resistor, and a second resistor shunt coupled to said capacitor and having a first end coupled to said second transistor collector and a second end adapted to receive a constant potential.

5. A circuit as claimed in claim 1 further comprising a comparison circuit means having a first input coupled to said providing means, a second input means for receiving a reference signal, and an output means coupled to said bases for supplying said control signal.

6. A circuit as claimed in claim 5 further comprising a detector circuit means coupled between said providing means and said comparison circuit first input.

7. A circuit as claimed in claim 1 further comprising means for always forwardly biasing said first transistor comprising a peak detector means having an input coupled to said output means and an output coupled to said input means.

8. A circuit as claimed in claim 7 wherein said detector circuit means comprises a diode forwardly coupled to said output means, a capacitor coupled to said diode and adapted to be coupled to a source of constant potential, a first resistor parallel coupled to said capacitor, and third transistor having emitter, base, and collector electrodes and disposed in a common base configuration, the collector-emitter path of said third transistor being coupled between an amplifier input and the junction of said capacitor and first resistor.

9. A circuit as claimed in claim 1 further comprising an input impedance element having a first end adapted to receive said input signal and a second end coupled to said input means; and another impedance element coupled between said input impedance element first end and said second transistor collector.

10. A circuit as claimed in claim 1 wherein said input means comprises a noninverting input and said amplifier further comprises an inverting input coupled to said first transistor collector; and further comprising a first resistor having a first end coupled to said inverting input and a second end adapted to be coupled to a constant potential; a second resistor coupled between said noninverting input to said second transistor collectors, and a third resistor having a first end coupled to said second transistor collector and a second end adapted to be coupled to a constant potential.

11. A circuit as claimed in claim 1 further comprising a third transistor of the same conductivity type as said first transistor and having a collector and a base coupled together and to the first transistor emitter and an emitter coupled to the collector of said first transistor, and means coupled between said emitters of said first and second transistors for producing the second transistor emitter voltage comprising a full wave rectifier.

* * * * *

UNITED STATES PATENT AND TRADEMARK OFFICE

CERTIFICATE OF CORRECTION

PATENT NO. : 3,921,091

DATED : November 18, 1975

INVENTOR(S) : THEODORUS JOZEF VAN KESSEL ET AL

It is certified that error appears in the above-identified patent and that said Letters Patent are hereby corrected as shown below:

Column 3, line 24, after "circuit" "it" should be -- is --.

Column 5, line 61, "aa" should be --a--;

Column 7, line 45, "$\frac{I_2}{I_1}$" should be --$\frac{I_2}{I_1}$--.

Signed and Sealed this

*Twentieth* Day of *September 1977*

[SEAL]

*Attest:*

RUTH C. MASON
*Attesting Officer*

LUTRELLE F. PARKER
*Acting Commissioner of Patents and Trademarks*